United States Patent
Sawyers et al.

(10) Patent No.: US 9,910,450 B2
(45) Date of Patent: Mar. 6, 2018

(54) DETERMINING AN ATTRIBUTE OF AN ADAPTER BASED ON A RATIO OF VOLTAGE DIVIDER OUTPUT VOLTAGES

(71) Applicant: HEWLETT-PACKARD DEVELOPMENT COMPANY, L.P., Houston, TX (US)

(72) Inventors: Thomas Sawyers, Houston, TX (US); Jon G Lloyd, Houston, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 237 days.

(21) Appl. No.: 14/779,162

(22) PCT Filed: Apr. 12, 2013

(86) PCT No.: PCT/US2013/036490
§ 371 (c)(1),
(2) Date: Sep. 22, 2015

(87) PCT Pub. No.: WO2014/168634
PCT Pub. Date: Oct. 16, 2014

(65) Prior Publication Data
US 2016/0054745 A1    Feb. 25, 2016

(51) Int. Cl.
*G01N 27/00* (2006.01)
*G05F 1/46* (2006.01)
(Continued)

(52) U.S. Cl.
CPC .............. *G05F 1/46* (2013.01); *G01R 19/10* (2013.01); *G01R 19/2506* (2013.01);
(Continued)

(58) Field of Classification Search
CPC .. H01R 13/6616; H01R 13/665; H01R 13/66; H01R 13/70; G01R 31/40;
(Continued)

(56) References Cited

U.S. PATENT DOCUMENTS 5,506,490 A * 4/1996 DeMuro ............... H02J 7/0011
320/106
7,581,130 B2   8/2009 Carroll et al.
(Continued)

FOREIGN PATENT DOCUMENTS

CN    101872230    10/2010
CN    102414638    4/2012
(Continued)

OTHER PUBLICATIONS

Maxim Integrated Products: Turorial 3426—Resistive Bridge Basics: Part One~10 pgs~Dec. 22, 2004 (Dec. 22, 2004), http://pdfserv.maximintegrated.com/.
(Continued)

*Primary Examiner* — Thang Le
(74) *Attorney, Agent, or Firm* — HP Patent Department

(57) ABSTRACT

An example provides an apparatus for determining an attribute of an adapter based on a ratio of voltage divider outputs. The apparatus may include a first analog-to-digital converter to provide a first digital signal corresponding to a first output voltage of a first voltage divider connected between a power node and a ground node, the first voltage divider formed, at least in part, when the apparatus is operatively coupled to the adapter. The apparatus may include a second analog-to-digital converter to provide a second digital signal corresponding to a second output voltage of a second voltage divider connected between the power node and the ground node. The attribute of the adapter may be determined based on a ratio of the output voltages.

20 Claims, 8 Drawing Sheets

(51) Int. Cl.
*G06F 1/26* (2006.01)
*G01R 19/10* (2006.01)
*G01R 19/25* (2006.01)
*G06F 1/16* (2006.01)
*G01R 27/14* (2006.01)

(52) U.S. Cl.
CPC ........... *G01R 27/14* (2013.01); *G06F 1/1632* (2013.01); *G06F 1/26* (2013.01)

(58) Field of Classification Search
CPC .............. G01R 31/31721; G01R 31/42; G01R 31/31924; G01R 11/32; G01R 33/072; G06F 1/28; G06F 1/3203; G06F 1/329; G06F 1/324; G06F 1/26
See application file for complete search history.

(56) References Cited

U.S. PATENT DOCUMENTS

| | | | |
|---|---|---|---|
| 8,248,035 B2 | 8/2012 | Kung | |
| 2003/0025401 A1* | 2/2003 | Popescu-Stanesti | H02J 7/0006 307/149 |
| 2003/0126474 A1* | 7/2003 | Sawyers | G06F 1/30 713/300 |
| 2004/0075419 A1 | 4/2004 | Massey et al. | |
| 2004/0254754 A1 | 12/2004 | Miyake et al. | |
| 2006/0020833 A1 | 1/2006 | Critz et al. | |
| 2006/0103996 A1* | 5/2006 | Carroll | G06F 1/3203 361/90 |
| 2006/0192530 A1* | 8/2006 | Nguyen | G06F 1/3203 320/128 |
| 2009/0177900 A1* | 7/2009 | Sawyers | G06F 1/26 713/300 |
| 2011/0060926 A1 | 3/2011 | Brooks et al. | |
| 2011/0179291 A1 | 7/2011 | Weng et al. | |
| 2013/0038142 A1 | 2/2013 | Sawyers | |

FOREIGN PATENT DOCUMENTS

| | | |
|---|---|---|
| CN | 103026574 | 4/2013 |
| WO | WO-2012/121687 A1 | 9/2012 |

OTHER PUBLICATIONS

Lee et al., "AC/DC Notebook Adapter with 22mW No-load Power Consumption," 8th International Conference on Power Electronics, 2011. ECCE~Asia, pp. 468-473. IEEE.

* cited by examiner

424

100 in accordance with various embodiments described herein. The apparatus 100 may be a stand-alone device or may be incorporated into various systems including, but not limited to, various computing and/or consumer electronic devices/appliances, such as desktop computers, mobile computers (e.g., a laptop computer, a handheld computer, a tablet computer, a netbook computer, a convertible computer, etc.), display devices, mobile phones, smart phones, personal digital assistants, or servers.

DETERMINING AN ATTRIBUTE OF AN ADAPTER BASED ON A RATIO OF VOLTAGE DIVIDER OUTPUT VOLTAGES

BACKGROUND

Electrical adapters are widely used to convert alternating-current into regulated direct-current for use with laptop computers, mobile phones, and other devices. Adapters are typically designed to provide a constant voltage up to some rated level of output power. Devices that require power but do not contain their own components to derive the required voltage from mains electricity are commonly sold with an adapter suited to provide the appropriate voltage for the device.

BRIEF DESCRIPTION OF THE DRAWINGS

The detailed description section references the drawings, wherein.

DETAILED DESCRIPTION OF EMBODIMENTS

Devices are commonly sold with a matching adapter suited to provide the appropriate voltage for the device. Though adapters can sometimes be matched with other devices, adapters are often generic and not clearly marked to identify the devices they are designed to power. As such, it may be difficult to re-use an adapter when separated from its matching device or to identify a replacement adapter for a device. Using an incompatible adapter may result in damage or destruction of a device.

Described herein are embodiments of apparatuses and methods for determining an attribute of an adapter. In various implementations, a first analog-to-digital converter may provide a first digital signal corresponding to a first output voltage of a first voltage divider connected between a power node of an adapter and a ground node, and a second analog-to-digital converter may provide a second digital signal corresponding to a second output voltage of a second voltage divider connected between the power node and the ground node. An attribute of the adapter may be determined based on a relationship between the first output voltage and the second output voltage. For example, in some examples, the power rating, the current rating, the output voltage, the manufacturer, the year of manufacture, other attribute, or a combination of attributes of the adapter may be determined based on a ratio of the first output voltage to the second output voltage or of the second output voltage to the first output voltage. One or more operations of an electrical load may be controlled in accordance with the determined attribute.

Figure 1:
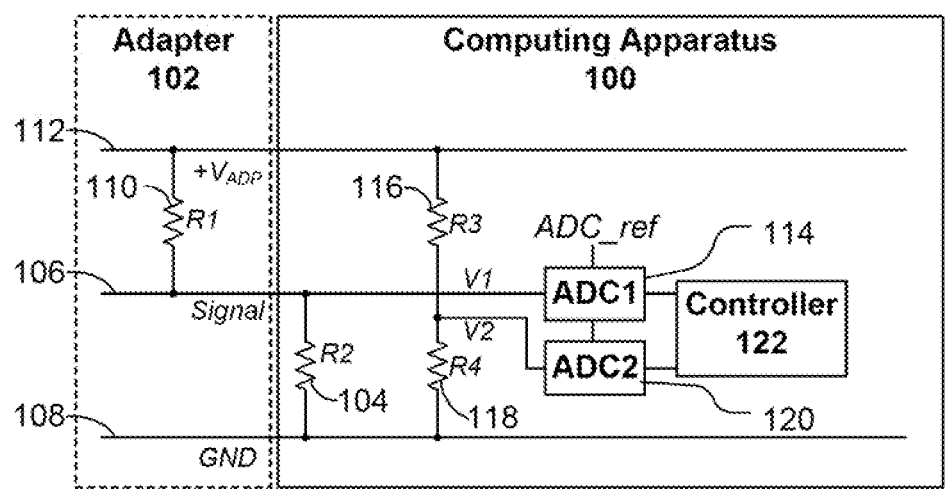
FIG. 1 illustrates an example apparatus, in accordance with various implementations.

Turning now to FIG. 1, illustrated is an example apparatus 100 in accordance with various embodiments described herein. The apparatus 100 may be a stand-alone device or may be incorporated into various systems including, but not limited to, various computing and/or consumer electronic devices/appliances, such as desktop computers, mobile computers (e.g., a laptop computer, a handheld computer, a tablet computer, a netbook computer, a convertible computer, etc.), display devices, mobile phones, smart phones, personal digital assistants, or servers.

The apparatus 100 may receive voltage-regulated, direct-current (DC) power from an electrical adapter 102, which may in turn be connected to a source (not illustrated) of alternating-current (AC) power. In some implementations, the adapter 102 may provide +12V, +15V, or +19.5V DC of regulated power. Other voltages may be possible. In various implementations, the apparatus 100 may operate to determine a maximum power rating for the adapter 102. The power rating can optionally be a continuous operating maximum or a temporary (e.g., 10 seconds, etc.) operating maximum. The determined power rating may then be used by the apparatus 100 in regulating its own operations so as to not exceed the power output capabilities or limits of the adapter 102.

A first voltage divider may be formed, at least in part, when the apparatus 100 is operatively coupled to the adapter 102. The adapter 102 may include a resistor 110 having a resistance R1, which may also be referred to as an adapter attribute resistor. The resistor 110 may be coupled between a power node 112 (adapter output voltage $+V_{ADP}$) and the signal node 106 (signal). The apparatus 100 may include a resistor 104 having a resistance R2 coupled between the signal node 106 and a ground node 108 (GND) such that the first voltage divider may be formed by the resistor 110 of the adapter 102 and the resistor 104 of the apparatus 100 when the apparatus 100 and the adapter 102 are operatively coupled. During operation, a regulated direct-current voltage may be provided between the adapter power node 112 and the ground node 108, and the first voltage divider may output a first output voltage V1 to a first analog-to-digital converter (ADC1) 114.

The apparatus 100 may include a set of resistors 116 (with resistance R3) and 118 (with resistance R4) connected in series between the power node 112 and the ground node 108. The resistors 1186, 118 may form a second voltage divider, as shown. During operation, the second voltage divider may output a second output voltage V2 to a second ADC (ADC2) 120.

Figure 2:
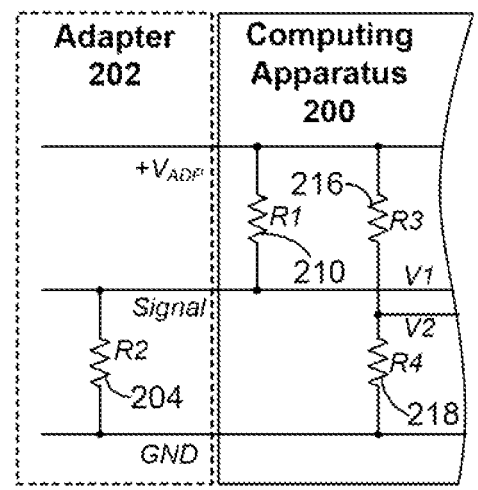
FIG. 2 illustrates another example apparatus, in accordance with various implementations.

Various other configurations for forming the voltage dividers may be possible. As illustrated in FIG. 2, for example, the adapter 202 may include a resistor 204 having a resistance R2, which may also be referred to as an adapter attribute resistor, and the resistor 204 may be coupled between the signal node and the ground node. The apparatus 200 (shown in partial view) may include a resistor 210 having a resistance R1 coupled between the power node and the signal node such that the voltage divider having an output voltage V1 may be formed by the resistor 210 of the apparatus 200 and the resistor 204 of the adapter 202 when the apparatus 200 and the adapter 202 are operatively coupled. Another voltage divider may be formed in the apparatus 200 by a resistor 216 having a resistance R3 and a resistor 218 having a resistance R4, with an output voltage V2.

Figure 3:
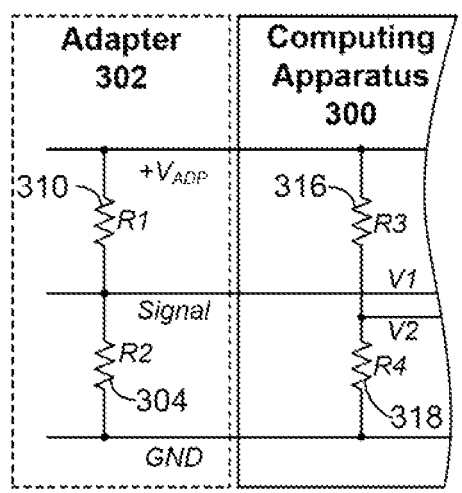
FIG. 3 illustrates another example apparatus, in accordance with various implementations.

In yet another example illustrated in FIG. 3, the adapter 302 may include the first voltage divider. As illustrated, the adapter 302 may include a resistor 310 having a resistance R1 and a resistor 304 having a resistance R2 coupled between the power node and the ground node, the resistors 304, 310 forming a voltage divider having an output voltage V1. Another voltage divider may be formed in the apparatus 300 (shown in partial view) by a resistor 316 having a resistance R3 and a resistor 318 having a resistance R4, with an output voltage V2.

Referring again to FIG. 1, in various implementations, the first ADC 114 and the second ADC 120 may each independently measure the input voltage $+V_{ADP}$ by reading the output voltages V1. V2, respectively, of the first and second voltage dividers, and provide digital signals corresponding to the measured voltages. In various implementations, the outputs of the first ADC 114 and the second ADC 120 may be output voltages V1. V2 as seen by the individual ADCs. For example, the output of the first ADC 114 may be the first output voltage V1 as seen by the first ADC 114, which may be the first output voltage V1 divided by the ADC reference voltage ADC_ref (i.e., V1/ADC_ref). Likewise, the output of the second ADC 120 may be the second output voltage V2 as seen by the second ADC 120, which may be the second output voltage V2 divided by the ADC reference voltage ADC_ref (i.e., V2/ADC_ref). In various implementations, these ratios may be multiplied by some factor representing the resolution of the ADCs, such as, for example, 1023× for a 10-bit ADC. For simplicity in this description, this factor is ignored, and resolution of the ADCs 114, 120 may be assumed to be high enough to not affect accuracy.

In various implementations, the ADC reference voltage ADC_ref may be the same for both the first ADC 114 and the second ADC 120. In other implementations, the ADC reference voltage ADC_ref may be different for the first ADC 114 and the second ADC 120. The various examples described herein use the same reference voltage ADC_ref, and in at least some implementations, may be preferred. As described more fully elsewhere, using the same reference voltage ADC_ref may allow for determination of an attribute of the adapter 102 that is independent of the ADC_ref.

The apparatus 100 may include a controller 122 to determine an attribute of the adapter 102 based on a relationship between the first output voltage V1 to the second output voltage V2. For example, the controller 122 may determine the power rating, the current rating, the output voltage, the manufacturer, the year of manufacture, other attribute, or a combination of attributes of the adapter 102 based on the relationship between the first output voltage V1 and the second output voltage V2. In various implementations, the controller 122 may determine the attribute of the adapter 102 by based on a ratio of the first output voltage to the second output voltage, or vice versa, the ratio corresponding to the attribute of the adapter 102. In some implementations, the controller 122 may determine a resistance value R1 of the resistor 110 of the adapter 102 based on a ratio of the first output voltage to the second output voltage, or vice versa, the resistance value R1 corresponding to an attribute of the adapter 102.

As described herein, readings by the first ADC 114 and the second ADC 120 may comprise the respective output voltages divided by the ADC reference voltage ADC_ref. As such:

$$V1/\text{ADC\_ref} = [V_{ADP} \times R2/(R1+R2)]/\text{ADC\_ref} \quad (1)$$
$$= [(V_{ADP}/\text{ADC\_ref})]/[(R1/R2+1)] \quad (2)$$

$$V2/\text{ADC\_ref} = [V_{ADP} \times R4/(R3+R4)]/\text{ADC\_ref} \quad (3)$$
$$= [(V_{ADP}/\text{ADC\_ref})]/[(R3/R4+1)] \quad (4)$$

The controller 122 may compare the two readings by dividing the reading of the first output voltage V1 by the reading of the second output voltage V2, resulting in:

$$V1/V2 = (R3, R4+1)/(R1/R2+1) \quad (5)$$

As can be seen by equation (5), the ratio of the first output voltage V1 to the second output voltage V2, as seen by their respective ADCs 114, 120, is independent of the input voltage $+V_{ADP}$ and independent of ADC_ref. Instead, the ratio of the first output voltage V1 to the second output voltage V2 depends only on the resistances of the resistors 110, 104, 116, 118. As the resistance values R2-R4 of the resistors 104, 116, and 118 may be known, the ratio value may allow for determining the resistance value R1 of the resistor 110. As such, the sources of error in determining the resistance R1 of resistor 110 may be limited to the tolerances of the four resistors 110, 104, 116, 118, and the finite resolution of the ADCs 114, 120.

Figure 4:
FIG. 4 is a table of example adapter resistance values with corresponding power ratings, in accordance with various implementations.

Once the resistance R1 of resistor 110 is determined, one or more attributes of the adapter 102 may be determined. FIG. 4 illustrates an example table 424 including values of adapter resistance values R1 for various corresponding power ratings, which may be used for apparatus 100 in determining the power rating of the adapter 102. So, for example, if the resistance R1 is found to be about 255 kilo-ohm (K) (+/−some tolerance), the power rating of the adapter 102 may be determined to be 105 watts (W).

In some implementations, an attribute of the adapter 102 may be determined based on the ratio of the first output voltage V1 to the second output voltage V2 or of the second output voltage V2 to the first output voltage V1. In various ones of these implementations, the lookup table 424 may include adapter attributes with corresponding ratio values of the first output voltage to the second output voltage, rather than or in addition to adapter attributes with corresponding adapter resistance values R1. For the example described with reference to FIG. 3, for example, the resistance values of resistors 310 and 310 may be unknown, which may necessitate using the ratio of output voltages for determining the attribute of the adapter 302.

In various implementations, the table 424 may be implemented in a lookup table (LUT), which may take the form of software or firmware of the apparatus 100. In some implementations, a computer-readable medium may include the LUT, and apparatus 100 may interact with the computer-readable medium when determining the attribute of the adapter 102.

Figure 5:
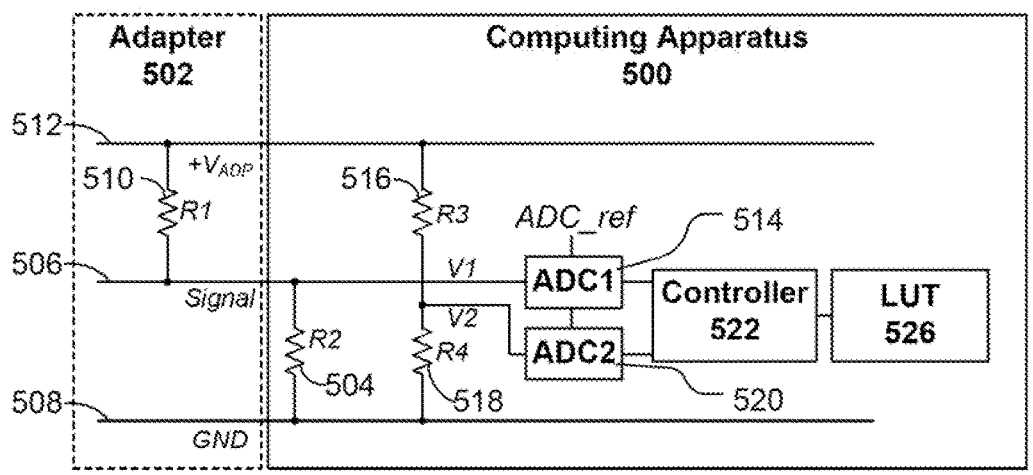
FIGS. 5-11 illustrate various example apparatuses, in accordance with various implementations.

FIG. 5 describes an example apparatus 500 including a LUT 526 having adapter resistance values with corresponding attributes for determining an attribute of the adapter 502. A first voltage divider may be formed by an adapter attribute resistor 510 of the adapter 502 and a resistor 504 of the apparatus 500 connected between a power node 512 and a ground node 508 when the apparatus 500 and the adapter 502 are connected, as illustrated. The apparatus 500 may include another set of resistors 518 and 518 connected in series between the power node 512 and the ground node 508, forming a second voltage divider. During operation, the first voltage divider and the second voltage divider may independently measure the voltage $+V_{ADP}$, the first voltage divider outputting a first output voltage V1 at a signal node 506 to a first ADC 514, and the second voltage divider outputting a second output voltage V2 to a second ADC 520.

The first ADC 514 and the second ADC 520 may provide digital signals corresponding to the measured voltages to the controller 522. The controller 522 may determine the attribute of the adapter 502 based on a ratio of the measured voltages or by determining a resistance value of the adapter 502 based on the ratio. For example, the controller 522 may determine the attribute of the adapter 502 based on a ratio of the first output voltage to the second output voltage, or vice versa. The controller 522 may determine the attribute of the adapter 502 using the determined ratio or resistance with reference to corresponding attribute values in the LUT 526.

Figure 6:
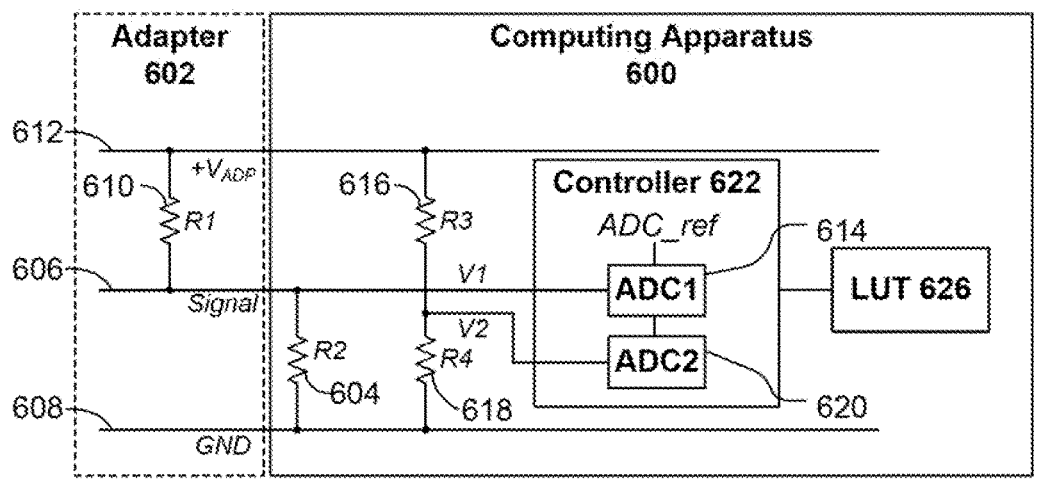

FIG. 6 describes another example apparatus 600 in which the controller 622 includes the first ADC 614 and the second ADC 620, as shown. As for various implementations described herein, a first voltage divider may be formed by an adapter attribute resistor 610 of the adapter 602 and a resistor 604 of the apparatus 600 when the apparatus 600 and the adapter 602 are connected, as illustrated, and may output a first output voltage V1 at a signal node 606 to the first ADC 614. A set of resistors 616 and 618 connected in series between a power node 612 and a ground node 608 may form a second voltage divider, which may output a second output voltage V2 to the second ADC 620. The controller 622 may determine the attribute of the adapter 602 based on a ratio of the measured voltages or by determining a resistance value of the adapter 602 based on the ratio. For example, the controller 622 may determine the attribute of the adapter 602 based on a ratio of the first output voltage to the second output voltage, or vice versa. The controller 622 may determine the attribute of the adapter 602 using the determined ratio or resistance with reference to corresponding attribute values in the LUT 626.

Figure 7:
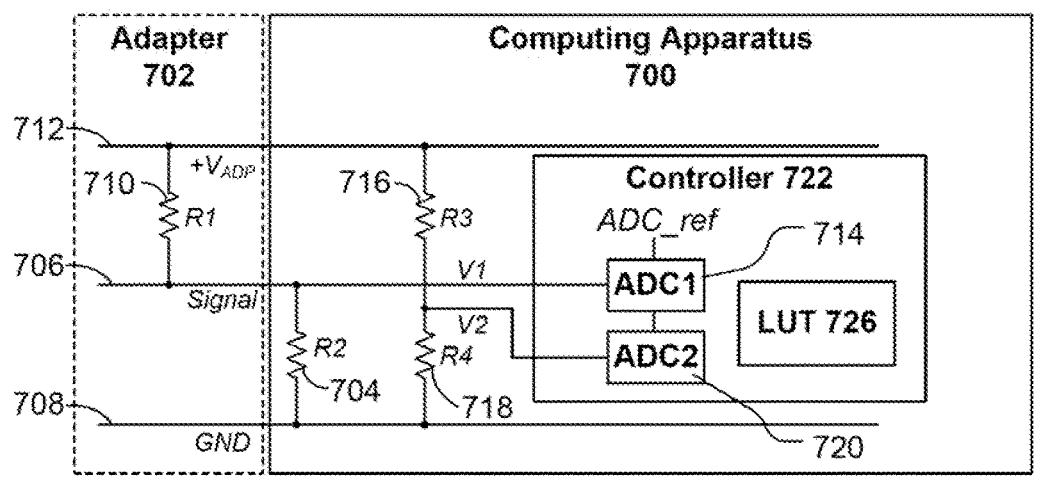

FIG. 7 describes yet another example apparatus 700 in which the controller 722 includes the first ADC 714, the second ADC 720, and the LUT 726 including adapter resistance or measured output ratio values with corresponding attributes. As for various implementations described herein, a first voltage divider may be formed by an adapter attribute resistor 710 of the adapter 702 and a resistor 704 of the apparatus 700 when the apparatus 700 and the adapter 702 are connected, as illustrated, and may output a first output voltage V1 at a signal node 706 to the first ADC 714 of the controller 722. A set of resistors 716 and 718 connected in series between a power node 712 and a ground node 708 may form a second voltage divider, which may output a second output voltage V2 to the second ADC 720 of the controller 722. The controller 722 may determine the attribute of the adapter 702 based on a ratio of the measured voltages or by determining a resistance value of the adapter 702 based on the ratio. For example, the controller 722 may determine the attribute of the adapter 702 based on a ratio of the first output voltage to the second output voltage, or vice versa. The controller 722 may determine the attribute of the adapter 702 using the determined ratio or resistance with reference to corresponding attribute values in the LUT 726.

Figure 8:
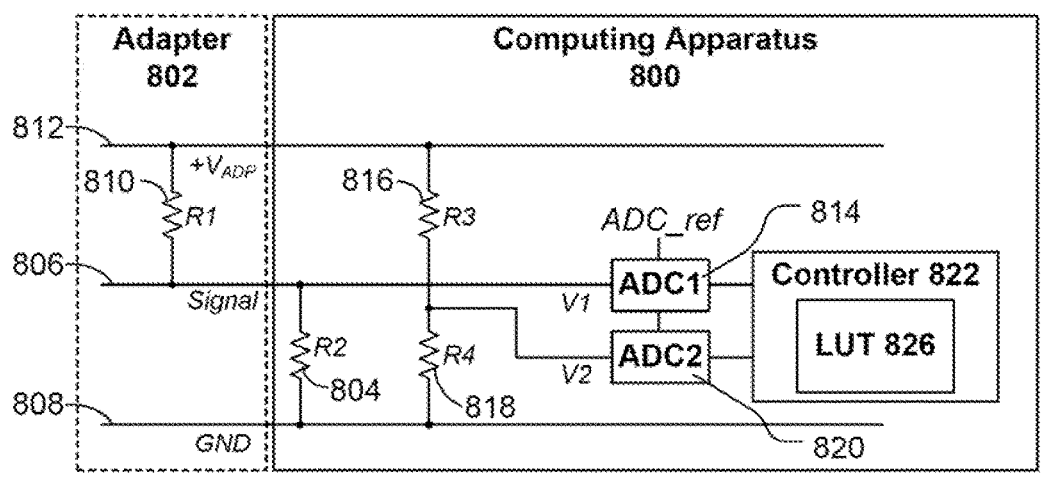

FIG. 8 describes yet another example apparatus 800 in which the controller 822 includes the LUT 826, and the first ADC 814 and the second ADC 820 are external to the controller 822, as shown. As for various implementations described herein, a first voltage divider may be formed by an adapter attribute resistor 810 of the adapter 802 and a resistor 804 of the apparatus 800 when the apparatus 800 and the adapter 802 are connected, as illustrated, and may output a first output voltage V1 at a signal node 806 to the first ADC 814. A set of resistors 816 and 818 connected in series between an adapter power node 812 and a ground node 808 may form a second voltage divider, which may output a second output voltage V2 to the second ADC 820. The controller 822 may determine the attribute of the adapter 802 based on a ratio of the measured voltages or by determining a resistance value of the adapter 802 based on the ratio. For example, the controller 822 may determine the attribute of the adapter 802 based on a ratio of the first output voltage to the second output voltage, or vice versa. The controller 822 may determine the attribute of the adapter 802 using the determined ratio or resistance with reference to corresponding attribute values in the LUT 826.

Figure 9:
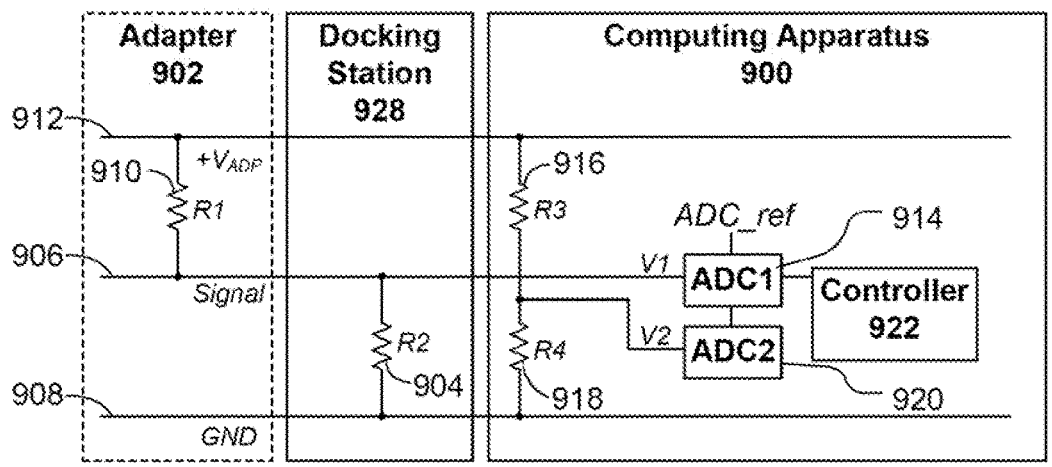

In various implementations, a docking station may be endowed with one or more components of the computing apparatuses described herein. As shown in FIG. 9, for example, a docking station 928 may include a resistor 904, which may form a first voltage divider with an adapter attribute resistor 910 of an adapter 902, when the adapter 902 and the docking station 928 are connected, and may output a first output voltage V1 at a signal node 906 to a first ADC 914 of the apparatus 900 when the docking station 928 and the apparatus 900 are connected. The apparatus 900 may include a set of resistors 916 and 918 connected in series between an adapter power node 912 and a ground node 908 to form a second voltage divider, which may output a second output voltage V2 to a second ADC 920 of the apparatus 900. The controller 922 may determine the attribute of the adapter 902 based on a ratio of the measured voltages or by determining a resistance value of the adapter 902 based on the ratio. For example, the controller 922 may determine the attribute of the adapter 902 based on a ratio of the first output voltage to the second output voltage, or vice versa. The controller 922 may determine an attribute of the adapter 902 based on the ratio or the resistance value, as described herein.

Although the apparatus 900 is shown with the first ADC 914 and the second ADC 920 are shown separate from the controller 922, the apparatus 900 may include the first ADC 914 and the second ADC 920, in accordance with various implementations described herein. Likewise, in various implementations, the apparatus 900 may include a LUT (not shown) including adapter resistance values or measured voltage ratios with corresponding adapter attributes. The LUT may be included in the controller 922.

Figure 10:
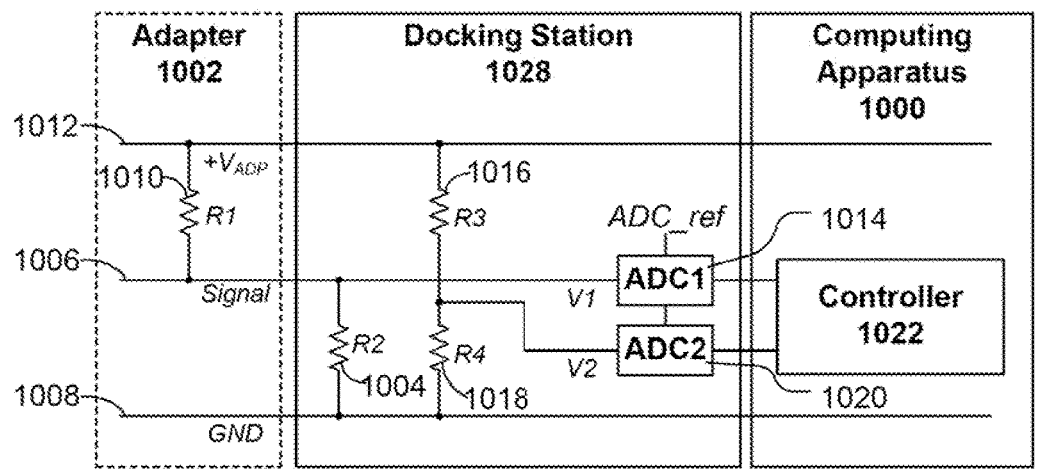

FIG. 10 describes yet another example docking station 1028, in accordance with various implementations. The docking station 1028 may include a resistor 1004, and set of resistors 1016, 1018 connected in series between a power node 1012 and a ground node 1008. The docking station 1028 may also include a first ADC 1014 and a second ADC 1020. The resistor 1004 which may form a first voltage divider with an adapter attribute resistor 1010 of an adapter 1002, when the adapter 1002 and the docking station 1028 are connected, and may output a first output voltage V1 at a signal node 1006 to the first ADC 1014. The set of resistors 1016 and 1018 may form a second voltage divider, which may output a second output voltage V2 to the second ADC 1020. The first ADC 1014 and the second ADC 1020 may provide digital signals corresponding to the measured voltages to a controller 1022 of the apparatus 1000 for determining a resistance value of the adapter 1002 based on the ratio of the first output voltage to the second output voltage, and determining an attribute of the adapter 1002 based on the resistance value. In various implementations, the apparatus 1000 may include a LUT (not shown) including adapter resistance values or measured voltage ratios with corresponding attributes. The LUT may be included in the controller 1022.

Figure 11:
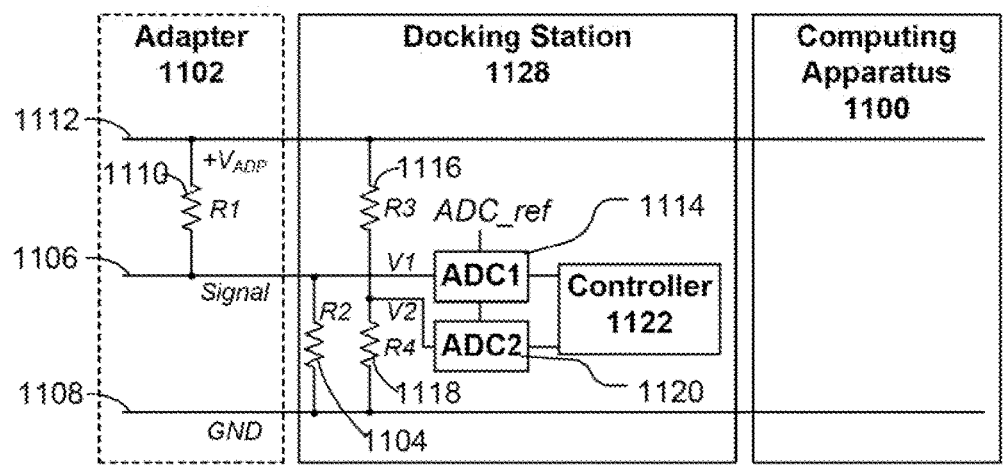

FIG. 11 describes still another example docking station 1128, in accordance with various implementations. The docking station 1128 may include a resistor 1104, set of resistors 1118, 1118 connected in series between an adapter power node 1112 and a ground node 1108, a first ADC 1114, and a second ADC 1120. The resistor 1104 which may form a first voltage divider with an adapter attribute resistor 1110 of an adapter 1102, when the adapter 1102 and the docking station 1128 are connected, and may output a first output voltage V1 at a signal node 1106 to the first ADC 1114. The set of resistors 1116 and 1118 may form a second voltage divider, which may output a second output voltage V2 to the second ADC 1120. The first ADC 1114 and the second ADC 1120 may provide digital signals corresponding to the measured voltages to the controller 1122. The controller 1122 may determine the attribute of the adaptor 1102 based on a ratio of the measured voltages or by determining a resistance value of the adapter 1102 based on the ratio. In various implementations, the docking station 1128 may include a LUT (not shown) including adapter resistance values or measured voltage ratios with corresponding adapter attributes. The LUT may be included in the controller 1122.

Figure 12:
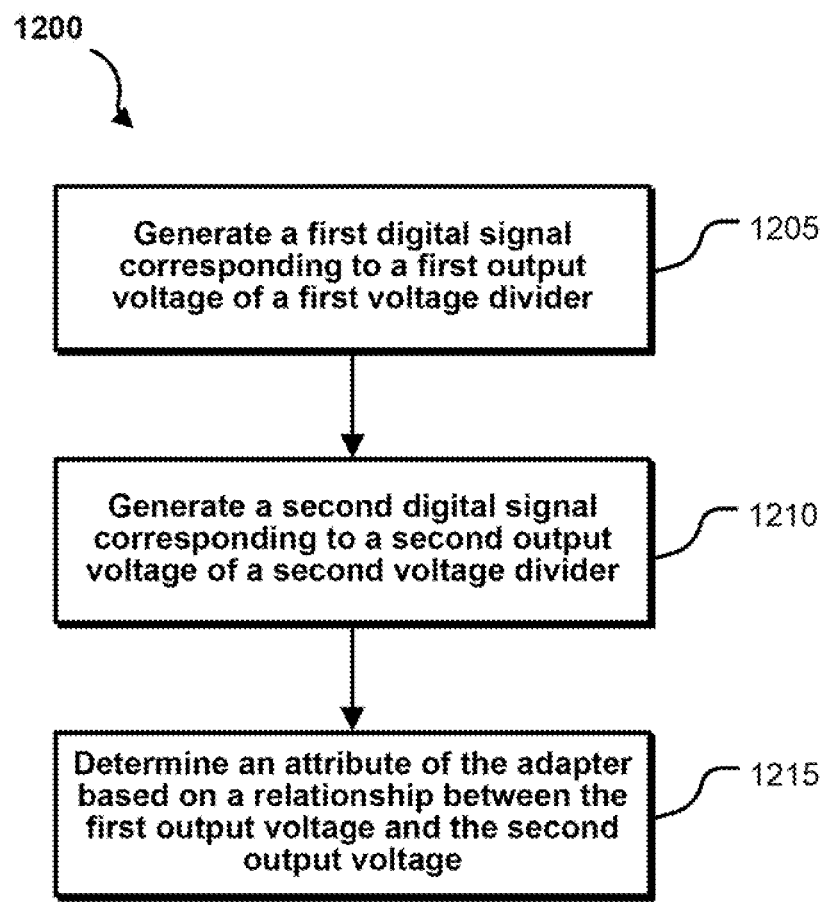
FIG. 12 is a flow diagram of an example method, in accordance with various implementations.
Figure 13:
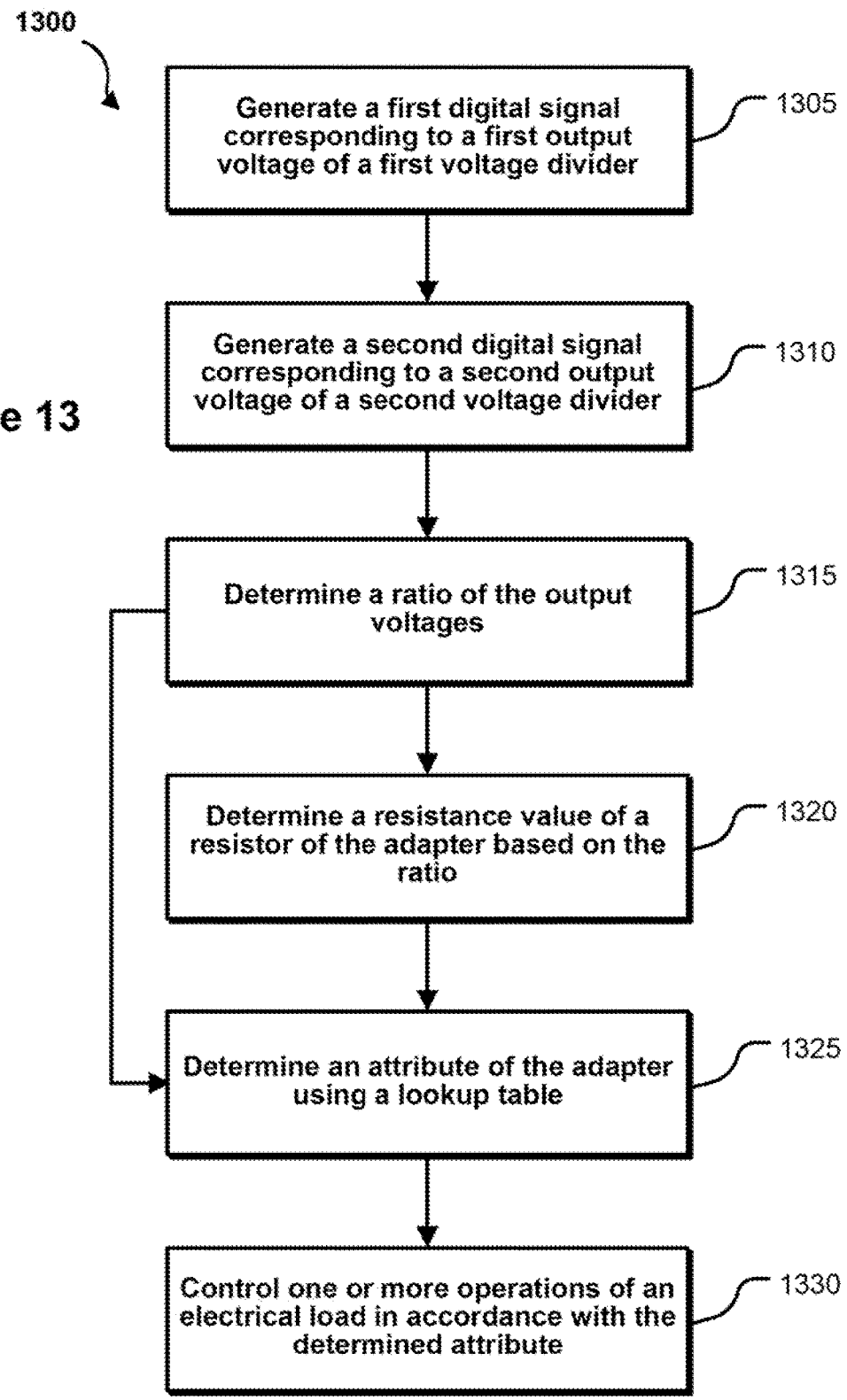
FIG. 13 is a flow diagram of another example method, in accordance with various implementations.

Flow diagrams describing various methods for determining an attribute of an adapter, in accordance with various implementations, are illustrated in FIGS. 12 and 13. In various implementations, one or both of the methods may be performed by an apparatus such as, for example, a computing apparatus, a docking station, etc. While the flow diagrams illustrate various operations in a particular order, the drawings are not intended to limit the present disclosure to any particular order. Additionally, the drawings are not intended to imply that all operations are required for all implementations.

Turning now to FIG. 12, processing for the method 1200 may begin or proceed with generating a first digital signal corresponding to a first output voltage of a first voltage divider (such as, e.g., R1 and R2), at block 1205. In various examples, the first voltage divider may be formed when an apparatus is operatively coupled to an adapter. In some implementations, the first voltage divider may be formed by a resistor of an adapter and a resistor of an apparatus, the first voltage divider connected between a power node (adapter output voltage $+V_{ADP}$) and a ground node. One of the resistors may be included in an apparatus such as, for example, a computing apparatus or a docking station, which may be connected between an adapter and a computing apparatus. The adapter may include the other resistor. In some implementations, both resistors of the first voltage divider may be disposed in the adapter.

The method 1200 may proceed with generating a second digital signal corresponding to a second output voltage of a second voltage divider (such as, e.g., R3 and R4), at block 1210. In various examples, the second voltage divider may be connected between the power node and the ground node.

The method 1200 may proceed with determining an attribute of the adapter based on a relationship between the first output voltage and the second output voltage, at block 1215. In various examples, a ratio of the first output voltage and the second output voltage, or vice versa, may be used for determining a resistance of the resistor of the adapter. The determined ratio or the determined resistance of the resistor may be used for determining the attribute of the adapter. In some examples, a LUT including ratios or resistance values with corresponding adapter attributes may be used for determining the attribute of the adapter.

FIG. 13 describes another example method 1300, in accordance with various implementations. The method 1300 may begin or proceed with generating a first digital signal corresponding to a first output voltage of a first voltage divider (such as, e.g., R1 and R2), at block 1305. In various examples, the first voltage divider may be formed when an apparatus is operatively coupled to an adapter. In some implementations, the first voltage divider may be formed by a resistor of an adapter and a resistor of an apparatus, the first voltage divider connected between a power node (adapter output voltage $+V_{ADP}$) and a ground node. One of the resistors may be included in an apparatus such as, for example, a computing apparatus or a docking station, which may be connected between an adapter and a computing apparatus. The adapter may include the other resistor. In some implementations, both resistors of the first voltage divider may be disposed in the adapter.

The method 1300 may proceed with generating a second digital signal corresponding to a second output voltage of a second voltage divider (such as, e.g., R3 and R3), at block 1310. In various examples, the second voltage divider may be connected between the power node (adapter output voltage $+V_{ADP}$) and the ground node.

The method 1300 may proceed with determining a ratio of the output voltages, at block 1315. In various implementations, the ratio may be a ratio of the first output voltage to the second output voltage. In other implementations, the ratio may be a ratio of the second output voltage to the first output voltage.

The method 1300 may proceed with determining a resistance value of the resistor of the adapter based on the determined ratio, at block 1320. As described herein, as the resistance values of the resistors of the apparatus connected to the adapter are known, the ratio value may allow for determining the resistance value of the adapter attribute resistor of the adapter.

The method 1300 may proceed with determining an attribute of the adapter using a lookup table, at block 1325. As described herein, the lookup table may include adapter resistance values with corresponding adapter attributes. The lookup table may be disposed in a docking station or an apparatus such as a computing apparatus, which may be connected to an adapter directly or via a docking station.

In some implementations, the method 1300 may proceed from block 1315 to block 1325, without determining the resistance value of the resistor of the adapter. In various implementations, the lookup table may include adapter attributes that correspond to ratio values of the measured output voltages.

The method 1300 may proceed with controlling one or more operations of an electrical load in accordance with the determined attribute, at block 1330. In various implementations, the apparatus may use a determined power rating to regulate or limit the number of or the intensity of operations being performed by the apparatus. For example, an apparatus may limit the operating frequency of a microprocessor, reduce the current drawn in charging a battery, or halt the use of wireless communications, as needed, to keep the power draw within the power rating of the adapter, while an optical storage device is being accessed. Other operational protocols and power limiting measures may also be implemented.

Various aspects of the illustrative embodiments are described herein using terms commonly employed by those skilled in the art to convey the substance of their work to others skilled in the art. It will be apparent to those skilled in the art that alternate embodiments may be practiced with only some of the described aspects. For purposes of explanation, specific numbers, materials, and configurations are set forth in order to provide a thorough understanding of the illustrative embodiments. It will be apparent to one skilled in the art that alternate embodiments may be practiced without the specific details. In other instances, well-known features are omitted or simplified in order not to obscure the illustrative embodiments.

The phrases "in an example," "in various examples," "in some examples," "in various embodiments," and "in some embodiments" are used repeatedly. The phrases generally do not refer to the same embodiments; however, they may. The terms "comprising," "having," and "including" are synonymous, unless the context dictates otherwise. The phrase "A and/or B" means (A), (B), or (A and B). The phrase "A/B" means (A), (B), or (A and B), similar to the phrase "A and/or B". The phrase "at least one of A, B, and C" means (A), (B), (C), (A and B), (A and C), (B and C), or (A, B and C). The phrase "(A) B" means (B) or (A and B), that is, A is optional.

Although certain embodiments have been illustrated and described herein, it will be appreciated by those of ordinary skill in the art that a wide variety of alternate and/or equivalent embodiments or implementations calculated to achieve the same purposes may be substituted for the embodiments shown and described without departing from the scope of this disclosure. Those with skill in the art will readily appreciate that embodiments may be implemented in a wide variety of ways. This application is intended to cover any adaptations or variations of the embodiments discussed herein. It is manifestly intended, therefore, that embodiments be limited only by the claims and the equivalents thereof.

What is claimed is:

1. An apparatus to receive power from an adapter, the apparatus comprising:
   a first analog-to-digital converter to provide a first digital signal corresponding to a first output voltage of a first voltage divider connected between a power node and a ground node, the first voltage divider formed, at least in part, when the apparatus is operatively coupled to the adapter;
   a second analog-to-digital converter to provide a second digital signal corresponding to a second output voltage of a second voltage divider connected between the power node and the ground node; and
   a controller to determine an attribute of the adapter based on a ratio of the first output voltage to the second output voltage or of the second output voltage to the first output voltage.

2. The apparatus of claim 1, wherein the controller is to determine the attribute of the adapter by determining the ratio, and determining the attribute of the adapter using a lookup table including ratio values with corresponding attributes.

3. The apparatus of claim 2, wherein the controller includes the lookup table.

4. The apparatus of claim 1, wherein the attribute is a power rating of the adapter.

5. The apparatus of claim 1, wherein the attribute is selected from a current rating, an output voltage, a manufacturer, a year of manufacture, and combinations thereof.

6. The apparatus of claim 1, further comprising a first resistor connected between a signal node and the ground node, wherein the first resistor is arranged to form the first voltage divider with a second resistor of the adapter when the apparatus is operatively coupled to the adapter.

7. The apparatus of claim 6, wherein the second voltage divider comprises the second resistor and a third resistor connected in series between the power node and the ground node.

8. The apparatus of claim 6, wherein the controller is to determine the attribute of the adapter by determining a resistance of the second resistor of the adapter connected between the power node and the signal node, based on the ratio, the resistance corresponding to the attribute.

9. The apparatus of claim 1, further comprising a first resistor connected between the power node and a signal node, wherein the first resistor is arranged to form the first voltage divider with a second resistor of the adapter when the apparatus is operatively coupled to the adapter.

10. The apparatus of claim 1, wherein the controller includes the first analog-to-digital converter and the second analog-to-digital converter.

11. The apparatus of claim 10, wherein the controller includes a lookup table including adapter resistance values with corresponding attributes, and wherein the controller is to determine the attribute of the adapter by determining a resistance value of the adapter based on the ratio and determining the attribute of the adapter using the lookup table.

12. The apparatus of claim 1, wherein the apparatus is a selected one of a docking station, a desktop computer, a laptop computer, a handheld computer, a tablet computer, a netbook computer, a convertible computer, a display device, a server, a smart phone, a personal digital assistant, or a mobile phone.

13. An apparatus comprising;
   a first resistor arranged to form a first voltage divider, between a power node and a ground node, with a second resistor of an adapter when the apparatus is operatively coupled to the adapter;
   a second voltage divider connected between the power node and the ground node:
   a first analog-to-digital converter to provide a first digital signal corresponding to a first output voltage at a signal node; and
   a second analog-to-digital converter to provide a second digital signal corresponding to a second output voltage of the second voltage divider, an attribute of the adapter corresponding to a ratio of the first output voltage to the second output voltage or of the second output voltage to the first output voltage.

14. The apparatus of claim 13, wherein the second voltage divider comprises a third resistor and a fourth resistor connected in series between the power node and the ground node.

15. The apparatus of claim 13, wherein the controller includes a lookup table including adapter resistance values with corresponding attributes, and wherein the controller is to determine the attribute of the adapter by determining a resistance value of the second resistor of the adapter based on the ratio and determining the attribute of the adapter using the lookup table.

16. The apparatus of claim 13, wherein the apparatus is a docking station.

17. A method comprising:
   generating, by a first analog-to-digital converter, a first digital signal corresponding to a first output voltage of a first voltage divider connected between a power node and a ground node and formed, at least in part when the apparatus is operatively coupled to an adapter;
   generating, by a second analog to digital converter, a second digital signal corresponding to a second output voltage of a second voltage divider connected between the power node and the ground node; and determining, by a controller, an attribute of the adapter based on a ratio of the first output voltage to the second output voltage or of the second output voltage to the first output voltage.

18. The method of claim 17, wherein said determining the attribute of the adapter comprising determining the ratio, and determining a resistance value of a resistor of the adapter based on the ratio.

19. The method of claim 18, wherein said determining the attribute of the adapter further comprises determining the attribute of the resistor of the adapter using a lookup table including adapter resistance values with corresponding attributes.

20. The method of claim 18, wherein said determining the attribute of the adapter comprising determining the ratio of the first output voltage to the second output voltage or of the second output voltage to the first output voltage, and determining a resistance value of the resistor of the adapter based on the ratio.

* * * * *

UNITED STATES PATENT AND TRADEMARK OFFICE
CERTIFICATE OF CORRECTION

PATENT NO. : 9,910,450 B2
APPLICATION NO. : 14/779162
DATED : March 6, 2018
INVENTOR(S) : Sawyers et al.

Page 1 of 1

It is certified that error appears in the above-identified patent and that said Letters Patent is hereby corrected as shown below:

On the Title Page

In item (72), Inventors, in Column 1, Line 1, delete "Thomas Sawyers" and insert -- Thomas P Sawyers --, therefor.

In the Claims

In Column 10, Line 66, in Claim 17, delete "analog to digital" and insert -- analog-to-digital --, therefor.

Signed and Sealed this
Tenth Day of July, 2018

Andrei Iancu
*Director of the United States Patent and Trademark Office*